stamps: 9/16/85 OR 4,612,432 SR

United States Patent [19]
Sharp-Geisler

[11] Patent Number: 4,612,432
[45] Date of Patent: Sep. 16, 1986

[54] ETCHING PLASMA GENERATOR DIFFUSOR AND CAP

[75] Inventor: Bradley A. Sharp-Geisler, San Jose, Calif.

[73] Assignee: Monolithic Memories, Inc., Santa Clara, Calif.

[21] Appl. No.: 651,192

[22] Filed: Sep. 14, 1984

[51] Int. Cl.⁴ .................... B23K 9/00; H01L 21/306
[52] U.S. Cl. ................. 219/121 PG; 156/345; 156/646; 204/192.35; 219/121 PD; 219/121 PF
[58] Field of Search ............... 219/121 PE, 121 PD, 219/121 PF, 121 PG; 156/643, 646, 345; 264/298, 192 E

[56] References Cited

U.S. PATENT DOCUMENTS

| 4,119,688 | 10/1978 | Hiraoka | 156/643 |
| 4,158,589 | 6/1979 | Keller et al. | 156/646 |
| 4,263,088 | 4/1981 | Gorin | 156/646 |
| 4,297,162 | 10/1981 | Mundt et al. | 156/345 |
| 4,422,896 | 12/1983 | Class et al. | 156/345 |

Primary Examiner—M. H. Paschall
Attorney, Agent, or Firm—Thomas S. MacDonald; Alan H. MacPherson; Steven F. Caserza

[57] ABSTRACT

A plasma generator includes a cap (20) having a sintered porous aluminium cuttings diffusor disc (28) spaced from the underside of a horizontal apertured top of the cap to prevent arcing therebetween and formation of a plasma plume affecting the wafer being etched. A plasma zone of reactive gases is formed between the cap and the wafer by rf energy. Process gases are conducted through cap top apertures (26) to the zone and the resultant plasma etches the semiconductor wafer spaced in parallelism from the cap top. Arcing between the metal diffusor and the metal cap is prevented by a ledge (27) on the cap interior periphery forming a gap between the bottom surface of the cap top and top surface of the diffusor. Etching or sputtering of the cap is also prevented by increasing the surface area of the apertures in the cap top to prevent ions from gaining a level of kinetic energy greater than the sputter threshold energy. This is done by increasing the number, changing the pattern and increasing the diameter of the apertures in the cap top as well as the thickness of the cap top, the latter increasing the height of the apertures. In the perferred embodiment, a central portion of the apertured cap is indented so as to provide for uniform etching across the width of the juxtaposed wafer by lessening the power density at a central location of the wafer.

11 Claims, 8 Drawing Figures

ETCHING PLASMA GENERATOR DIFFUSOR AND CAP

BACKGROUND OF THE INVENTION

1. Field of the Invention

This invention relates to plasma generators which generate with radio-frequency (rf) energy a plasma for etching semiconductor wafers in the semiconductor fabrication industry. More particular, it pertains to improvements in the cap and diffusor used in forming an etching plasma between a hot energy-emitting electrode and a semiconductor wafer functioning as a ground electrode.

2. Prior Art

Plasma etching apparatus usable with treatment of semiconductor wafers are seen in U.S. Pat. Nos. 4,094,722; 4,245,154; 4,252,595; and 4,282,077. In each, an etching gas activated by an electrically-generated plasma is used to etch various surfaces of a wafer.

In a plasma generator wafer etching machine known as the SIGMA 80 machine, sold by Branson/IPC, a SmithKline-Beckman company of Hayward, Calif., and described in Solid State Technology, August 1982, pages 88–92, a plasma is formed across a hot rf emitting electrode and a ground electrode in the form of a semiconductor wafer work-piece. The wafer work-piece is held in a pivotable chuck in parallelism with the hot electrode. An isolated plasma reaction region is formed between the electrodes. A suitable etchant process gas is introduced into that region and, upon flow of rf energy in the region, a high energy wafer-etching plasma is produced which etches unmasked area of the wafer particularly silicon oxide layers on the wafer. A circular silicon-coated cap and diffusor is provided over the hot electrode, the diffuser being in the form of a flat circular disc or plate made from sintered aluminium cuttings and fitted within the cap interior. It has been found that the cap must be replaced after processing about 1,200 wafers as its 15 mils of silicon coating (to deter sputter induced metal ion contamination) is consumed during the etching process. A quartz focus ring surrounds the powered electrode cap to inhibit plasma coupled to other reactor surfaces. Further, with the diffusor employed, the cap has a propensity for arcing at points between the cap and diffusor. Arcing can cause burnt resist on the wafer and burn spots on the underside of the cap near the junction of the cap and diffusor as shown in the Prior Art FIG. 2.

Under rf current flow there will be a lag between the cap and the diffusor. The gap between the cap and diffusor (there are a finite number of points of contact between the cap and diffusor and consequently there is a gap everywhere else) forms the capacitor and the lateral conduction path through the cap forms the inductance in the equivalent Prior Art circuit shown in FIG. 6. A voltage difference between the cap and diffusor will (to the first order) be proportional to this lag (ac voltage difference). As the cap heats and expands in use, a point of contact between the cap and diffusor passing current comes out of contact and begins arcing. This arc generates ions and free electrons which can diffuse through holes in the cap. Once through the holes, they will act as seeds for carrier multiplication across the dark space. The resistance will be lower in this region which will have the effect of robbing power from neighboring regions and funnelling it into that one region; hence causing arcing. Once this occurs it will tend to be reinforced by the following phenomenon: The current in the plasma arc has an associated magnetic field which opposes lateral conduction along the cap to the diffusor. This will tend to increase the arcing between the cap and diffusor which, in turn, will increase the number of carriers generated under the cap.

To prevent contamination of the wafer on the opposite electrode, the Sigma 80 machine has the cap coated with a material (silicon) which will not be a contaminant when vaporized as it would not react with the plasma and would be pumped harmlessly out the exhaust. This, however, does consume reactive species and necessitates higher flow rates than would be needed were this consumption of the coating not taking place (higher process gas consumption). Also the silicon coating is consumed during etching, particularly rapidly on the outer ridge, resulting in a serious arcing problem and the need to replace the expensive cap when the silicon coating wears through.

SUMMARY OF THE INVENTION

The arcing problem at the cap/diffusor interface was essentially eliminated by providing a means for preventing extension of the plasma sheath, formed by the interaction of the generator and reactive gas in a reaction chamber, to the diffusor disc. In the preferred mode, this is done by a spacer means provided in the form of a ledge in the interior upper periphery of the cap so that a gap is maintained between the bottom of the horizontal top of the cap and the top of the diffusor within the cap.

The present invention further provides for a means for reducing etching (sputtering) of the cap by preventing ions from gaining a level of kinetic energy greater than the sputter threshold energy. This is accomplished by providing a large number of sized apertures or channels with sufficient exposed surface area in the cap top so that the cap sheath area can be increased. This results in a rapid decrease in sputter rate on the cap. This construction obviates the necessity of having a silicon coating on the cap and periodically needing to replace the cap. It also obviates the need of the quartz focus ring used in the prior art. The cap for use under 10 Torr/1000 W. operating conditions has through-apertures on a hexagon pattern over the entire top face of a relative thick horizontal cap top.

DETAILED DESCRIPTION

Figure 1:
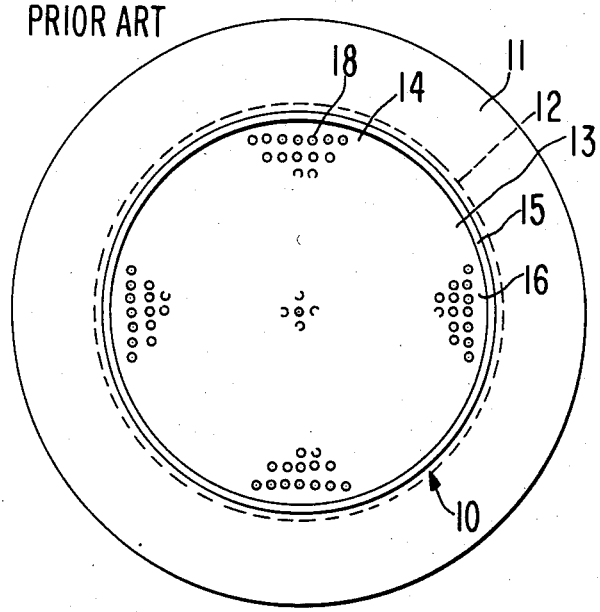
FIG. 1 is a top view of a prior art cap and focus ring.

FIG. 1 shows the prior art Sigma 80 cap 10 and focus ring 11. The cap 10 comprises a vertical cylindrical outer wall 12 having a 4½" OD, 4 1/16" ID and a ½" interior height. A horizontal top 13 of a constant thickness of 0.10" extends across the outer wall to form an inverted cap. An exterior horizontal annular ridge 14 and a vertical annular ridge 15 extending above a flat surface 16 of the top 13 forms a peripheral top surface for receiving the inner periphery of a flat quartz focus ring 11. Ring 11 functions to confine the plasma and prevents plasma coupling with the wall 12 and other parts of the hot electrode (not shown). The cap is bolted to the hot electrode by bolts inserted in capped holes 19. A pattern of small apertures 18 extend orthogonally in x-y axis rows across all of surface 16 (although only selected apertures are shown). A consumable silicon coating is provided over surface 16 and the exterior of walls 12 to protect against sputtering of the aluminum cap since aluminum sputtered off the cap will contaminate the wafer.

Figure 2:
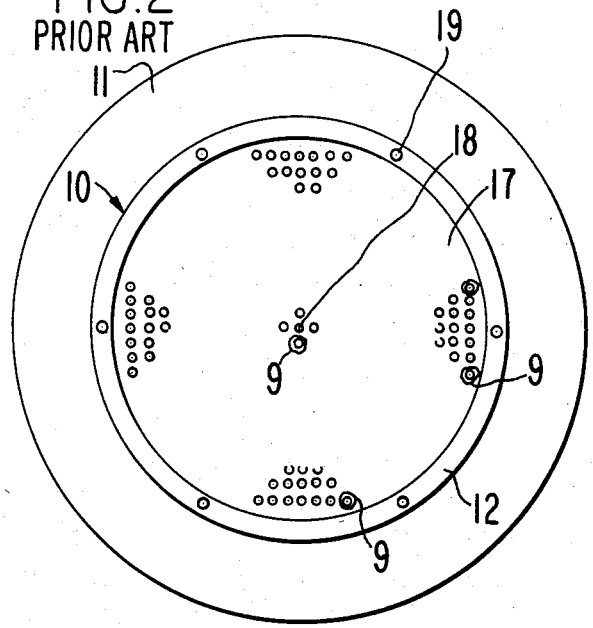
FIG. 2 is a bottom view of the prior art cap and focus ring of FIG. 1.

FIG. 2 shows the underside of cap 10 particularly illustrating depending side wall 12 and tapped holes 19. The bottom surface 17 of the top wall 13 abuts the top of a disc-like diffusor (not shown) which is press fitted within walls 12 and extends the height of the cavity formed by surface 17 and walls 12. The diffusor is constructed of sintered aluminum cuttings forming a porous filter-like mass which provides uniform flow dispersion of the process gas which is forced through the diffusor. As can be seen in FIG. 2, when passing the prescribed 13.56 megahertz of rf energy through the diffusor, burn spots 9 are formed between out-of-contact areas between the underside of the cap and the inserted diffusor, particularly as the cap and diffusor differentially move when heated in operation causing arcing. The arcing further causes more plasma to be generated at those aperture locations. More ions are generated and plasma plumes are formed extending up through the apertures. The plasma becomes brighter in the gap between the cap top surface 16 and the wafer which is horizontally aligned above that surface causing burnt spots on the wafer itself. This is a serious problem both in the destruction of the cap itself and in lessening the production yield of the integrated circuit chips or other yield of electronic devices being formed on the wafer(s). In this prior device, the dark area has sufficient height so that the plasma plume does not extend into the apertures 18 which function only to convey the process gas to the plasma generating zone facing the wafer.

Figure 3:
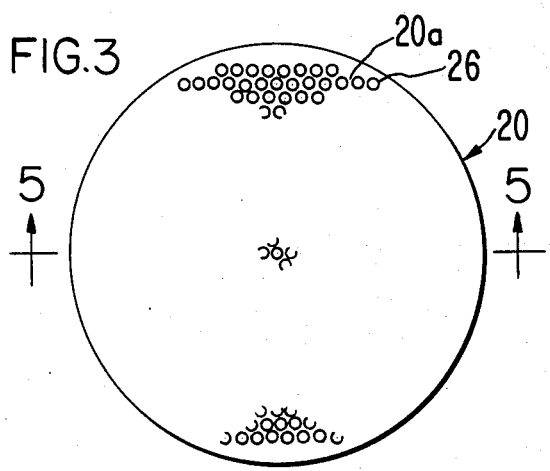
FIG. 3 is a top view of the improved plasma generator cap.

FIG. 3 illustrates an improved cap 20 which grossly increases the surface area by providing an increased number of larger and deeper apertures 26 within the top of the cap so as to prevent etching or sputtering of the cap. This construction obviates the need and expense of a silicon coating on the cap exterior, cap replacements and the concomitant increase in usage of reactive species in consuming the silicon coating. Apertures 26 are provided in a hexagon pattern over the entire top to maximize the number of apertures and increase the total surface area of the apertures formed in the cap top. Only selected groups of apertures are shown so as to not clutter the drawing. This pattern results in greater homogeneity of the plasma plumes and obviates a mottled appearance of the wafer surface apparent in the prior art cap and diffuser of FIGS. 1 and 2. The apertures are on 0.15 inch centers with a 0.13 inch separation between center lines of adjacent rows. A countersunk bevel is provided at each hole entrance on the cap top surface to minimize curvature and the associated high electrical field which would cause sputtering of the cap.

Figure 4:
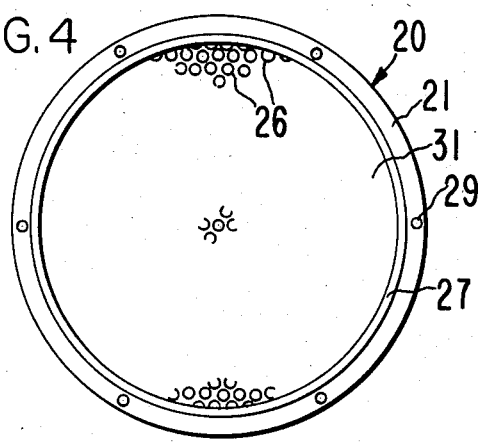
FIG. 4 is a bottom view of the cap of FIG. 3.

FIG. 4 shows the underside of the improved cap including the vertical cylindrical wall 21 containing tapped bolt holes 29 corresponding to holes 19 in the prior art cap. An interior ledge 27 is formed between the bottom surface 31 of the top 20a of the cap and the top surface 32 of a thin porous diffusor disc 28 (FIG. 5) press fitted into the interior cavity formed by the ledge underside and cylindrical wall 21.

Figure 5:
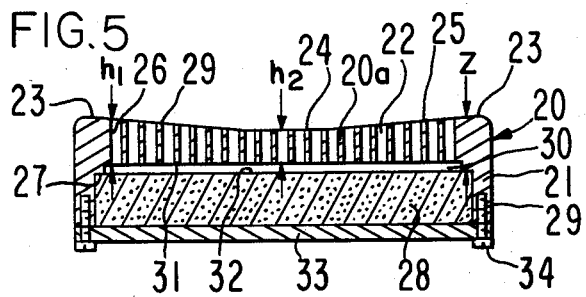
FIG. 5 is a schematic cross-sectional view of the improved cap with diffusor in place taken on the line 5—5 of FIG. 3.
Figure 6:
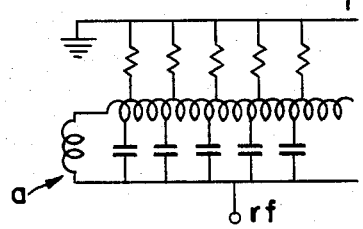
FIG. 6 is an equivalent electrical circuit schematic of the prior art device.

FIG. 5 shows in more detail the formation of a gap 30 between the top under surface 31 and the diffusor disc top surface 32. The diffusor is mounted in abuttment with the top of rf electrode 33 and the cap bolted to the electrode by bolts 34. The member 33, disc 28 and cap 20 together comprise the (hot rf electrode. The aluminium cap top thickness and height of the apertures is about 0.25-0.35 inches compared to a height and thickness of 0.10 inches of the prior art Sigma 80 cap, shown in FIGS. 1 and 2. The number of apertures has been increased, for a 4½ inch O.D. cap, from about 490 to about 570 with each aperture being of 0.06 inch diameter in the prior art cap and 0.12 inch diameter in the improved cap. In terms of surface area (without compensating for the silicon coating within the apertures in the prior art cap) an increase of cell area from 12.5 sq. inches to 66 sq. inches is provided, an increase of at least 525%. The ratio of the total aperture cell area to the cap top area is preferably from about 2 to about 6. The ratio of the diameter of the aperture to the depth of the aperture should be at least about two for preferable operations. Lower pressure plasmas will dictate larger and deeper apertures.

In a preferred embodiment a flat central portion 24 of about 1.0 inch OD is provided in the cap top through which apertures 26 are formed having a height $h_2$ of 0.25". At the radial exterior edges a flat sector 23 is provided where the apertures have a greater height $h_1$ of 0.35". Distance Z of 0.45" indicates the distance between flat 23 and ledge 27. Other apertures 26 are contained in a tapered sector 25 having aperture heights varying between $h_1$ and $h_2$. The above indentation 24 in the cap 24 improves uniformity of etch across the wafer surface and prevents faster etching in the middle of the wafer which is juxtaposed to the cap. The reactive gas is diluted by used gas from the wafer center as etching occurs at outward radial portions of the wafer. Providing for a larger gap in the center between the cap and wafer (by indentation 24) creates more resistence of rf energy flow through the plasma and thus lessens the power density in the center portions of the wafer, compensating for the more reactive species at that location.

The construction shown in FIGS. 3-5 prevents both arcing and resulting burn spots in the cap and wafer and also prevents sputtering or etching of the cap surfaces caused by the dc potential between the plasma and the cap. The theory explaining the cap erosion and high process gas consumption resultant from use of the prior art device of FIGS. 1 and 2 is as follows:

When a plasma is formed between two parallel plates an inhomogeneity of carriers arises near the plates. This is due to the fact that when an electron or ion strikes a surface (metal) it stands an excellent chance of being neutralized (a free electron will be collected, a positive ion will accept an electron from the surface or a negative ion will donate an electron). This gives rise to a depletion (of charge carriers) zone near the surface, some multiple of mean-free paths thick. The voltage drop per distance (or electric field strength) is inversely proportional to conductance and proportional to current (Ohms law) thus the region near the plates has the greatest voltage drop. This zone results in etching (sputtering) of the electrode cap. To prevent this material from contaminating the water on the opposite electrode, the prior art apparatus cap was coated with a material (silicon) which would not be a contaminant when vaporized. This, however, does consume reactive species and necessitates higher flow rates of gas than would be needed were this not taking place (higher process gas consumption). Also the silicon coating is consumed during etching (quite rapidly on the outer ridge) resulting in the need to replace the cap when it wears through. The present invention reduces the sputtering at the cap. This is accomplished by taking advantage of the following mechanism.

Figure 7:
FIG. 7, is a schematic of the physical relationship of the cap, dark space and plasma.
Figure 8:
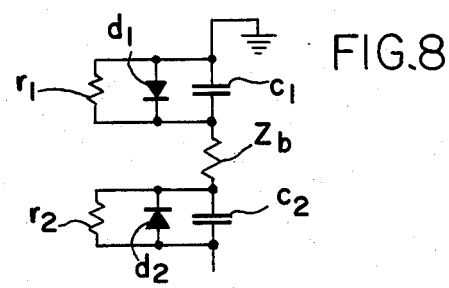
FIG. 8 is the equivalent electrical circuit schematic of FIG. 7.

FIG. 7 shows the physical relationship between the cap, dark space and plasma. The equivalent electrical schematic is shown in FIG. 8.

The rf voltage across $c_2$ ($V_{rf2}$) is proportional to $$\text{the reactance} = r_2 X_{c2} = X_2 \sqrt{r_2^2 + X_{c2}^2} \tag{1}$$

where $X_{c2} = 1/2\pi f c_2$ is the capacitive reactance
$r_2$ is the resistance in parallel and
$f$ is the frequency of the rf voltage Now $$c_2 = \epsilon_S(A_2/t_2) \text{ and } r_2 = (t_2 \rho_s/A_2) \tag{2}$$

where $\gamma_s$ is the permittivity of the dark space
$A_2$ is the area of the cap sheath
$t_2$ is the thickness of the dark space (depletion region)
$\rho_s$ is the resistivity of the dark space.

So $$X_{c2} = \left(\frac{t_2}{A_2}\right)\left(\frac{1}{2\pi f \epsilon_S}\right) = \left(\frac{t_2}{A_2}\right)(k)$$

letting $k = 1/2\pi f \epsilon_s$ and substituting into (1) we have:

$$X_2 = \tag{3}$$

$$\left(\frac{t_2 \rho_s}{A_2}\right)\left(\frac{t_2}{A_2}k\right) \bigg/ \sqrt{\left(\frac{t_2}{A_2}\rho_s\right)^2 + \left(\frac{t_2}{A_2}k\right)^2} = \frac{t_2}{A_2}\frac{\rho_s k}{\sqrt{\rho_s^2 + k^2}}$$

So we can write:

$$V_{rf2} = I_{rf} \cdot X_2 = I_{rf} \frac{t_2}{A_2}\left(\frac{\rho_s k}{\sqrt{\rho_s^2 + k^2}}\right) \tag{4}$$

The diode action ($d_1$, $d_2$) is due to the higher ($2 \times 10^5$) mobility of electrons than helium ions. This gives rise to a dc voltage across the dark space (of such magnitude that the net electron flux out of the plasma is equalled by the net positive ion flux). This dc voltage ($V_{dc2}$) will be some fraction ($0 < f < 1$) of the rf voltage across the dark space ($V_{rf2}$), hence:

$$V_{dc2} = f \cdot V_{rf2} = f \cdot I_{rf} \cdot t_2 \cdot \frac{\rho_s(k)}{\rho_{s2} + k_2} \tag{5}$$

Sputtering of the aluminium cap can only occur when an ion gains kinetic energy greater than the sputter threshold energy (13 eV for Al) and impacts the surface of the cap. In that the mean free path of helium at 10 torr is 21 micro inches (approx.) the sputter rate (R) will be free-path (L) limited and the sputter rate (R) will decrease exponentially with electric field strength $|\vec{E}|$. Hence:

$$R = M \exp(-L_o|\vec{E_o}|/E(L_1)|\vec{E}|) \tag{6}$$

where;

$L_o$ is the threshold freepath required for sputtering with electric field strength $|E_o|$ (absolute value)
$M$ = constant
$E(L)$ = mean free path = $1/\pi a \rho^2$
$\rho$ = radius of atom
$a$ = density of atoms
$|\vec{E}|$ = electric field strength = $V_{dc}/t_2$ $$\therefore |\vec{E}| = f \cdot I_{rf} \cdot \frac{1}{A_2} \cdot \frac{\rho_s(k)}{\sqrt{\rho_s^2 + k^2}} \text{ from (5) and} \tag{7}$$

$$R = M \exp - [L_o|\vec{E}|/(f \cdot I_{rf} \cdot \rho_s K/\sqrt{\rho_s^2 + K^2} \ E(L)] A_2$$

Now, of course, (7) describes the sputter rate per square area so that the total sputter rate $R_t = RA_2$ so we have:

$$R_T = A_2 M_{exp} - [J]A_s \tag{8}$$

where [J] is the power expression in equation (7)
From (8) we see that with a large "J" a rapid decrease in sputter rate occurs with increasing $A_2$.

This increasing of the cap sheath area can be accomplished by riddling the cap with apertures or laterally cut channels:

A carrier if accelerated into an aperture will not become neutralized (except through recombination which occurs within the plasma everywhere else anyway) because it won't bump into the aperture surface.

Once inside it will lose kinetic energy through collisions with other atoms. It will have low drift (not being acted upon by any strong electric field) and will be free to diffuse out again during, say, the next half cycle which will accelerate it in the opposite direction, the electrons giving rise to carrier multiplication. The plasma then will begin to extend down into the apertures thus increasing the sheath area and causing plumes.

The apertures must be large enough to accommodate the sheath and form a finger of plasma sufficiently large enough to handle the current. The holes should be small enough to not give rise to local non uniformities, and should be closely spaced and several hole diameters deep to maximize sheath area.

Etch gases as described in the Solid State Technology article identified above may be utilized to supply the active species and the etching plasma. It has been found that the construction of a spacer ledge within the cap and the greater surface area of the apertures in the cap top permits month-after-month of normal etching operations without the need for cap replacements, unlike operations with the prior art cap and diffusor. It has been observed that an increased amount of fluoropolymer is formed in the plasma from the $CHF_3$—$C_2F_6$ gases which coat the cap exterior vertical surfaces and on the horizontal cap surfaces between the apertures. The phenomenon thus indicates that sputtering on the cap is reduced.

While the present invention has been described in terms of a 10 torr etching system (the Sigma 80 system) it may also be applied to lower vacuum systems such as a 1 torr system. In such event larger apertures would be used in a thicker topped cap. As the (torr) pressure in the system increases, the dark space becomes thinner and it is possible to utilize smaller apertures.

The above description of the preferred embodiment of this invention is intended to be illustrative and not limiting. Other embodiments of this invention will be obvious to those skilled in the art in view of the above disclosure.

I claim:

1. In a plasma generator wafer-etching machine having an rf emitting electrode, semiconductor wafer-mounting chuck spaced from said emitting electrode forming a plasma reaction zone therebetween and wherein said emitting electrode includes a cap having multiple apertures and a gas diffusor within said cap, a top surface of said cap bounding one side of said zone and wherein said apertures are positioned to receive and convey an etching gas to said zone, the improvement comprising:

means operable at a given dark dspace thickness including a predetermined RF power level and a predetermined pressure of etching gas and including having said apertures of sufficient surface area for permitting a plasma sheath resultant from plasma formed in said zone to extend into said apertures from said zone while preventing extension of the plasma sheath from said cap to said diffusor; and means for reducing sputtering of said cap by providing that said apertures are of such diameter and depth such that the plasma sheath area adjacent to the cap is maximized.

2. The invention of claim 1 in which said means for reducing sputtering comprises, having each said aperture of a diameter and height sufficiently large to accommodate the plasma sheath without giving rise to local nonuniformities in wafer etch rate.

3. The invention set forth in claim 2 in which said apertures are in multiple hexagon patterns across essentially all of the top surface of said cap.

4. The invention set forth in claim 1 further comprises means spaced between said cap and said diffusor for preventing arcing between said diffusor and said cap.

5. The invention of claim 4 in which said means for preventing arcing comprises a ledge on an inner peripheral wall of said cap extending between said apertured cap and said diffusor such that a gap is formed between the cap and diffusor.

6. The invention of claim 5 in which said diffusor extends from said ledge to a bottom edge of said cap.

7. The invention of claim 1 wherein said cap has an apertured top with circular apertures having a vertical height greater than $r/2$ where $r$ is the radius of the apertures.

8. The invention of claim 7 wherein the height of said apertures formed in a central portion of the cap top are less than the height of apertures formed radially of said central portion such that uniformity of etch over the surface of a wafer is obtained.

9. The invention set forth in claim 8 in which said cap top includes an apertured tapered radial portion extending from said central portion to vertical edge portions of said cap.

10. The invention set forth in claim 1 in which the ratio of the total area of said apertures to the area of the cap bounding said zone is from about 2 to about 6.

11. The invention set forth in claim 4 in which said diffusor is spaced from said cap apertures.

* * * * *